United States Patent

[11] 3,612,922

[72] Inventor Thomas J. Furnival
Logansport, Ind.
[21] Appl. No. 88,455
[22] Filed Nov. 10, 1970
[45] Patented Oct. 12, 1971
[73] Assignee General Motors Corporation
Detroit, Mich.

[54] METHOD OF MOUNTING A PIEZOELECTRIC DEVICE
3 Claims, 4 Drawing Figs.

[52] U.S. Cl. .......... 310/9.1, 310/8.2, 310/9.6, 333/72
[51] Int. Cl. .......... H01v 7/00
[50] Field of Search .......... 310/9.1–9.4, 9.6, 8.2; 333/72

[56] References Cited

UNITED STATES PATENTS

| | | | |
|---|---|---|---|
| 2,128,420 | 8/1938 | Laskey | 310/9.4 |
| 2,155,035 | 4/1939 | Bieling | 310/9.4 X |
| 2,157,701 | 5/1939 | Hight | 310/9.2 X |
| 2,877,432 | 3/1959 | Mattiat | 333/72 |
| 3,067,345 | 12/1962 | Harris | 310/9.1 X |

*Primary Examiner*—D. F. Duggan
*Assistant Examiner*—Mark O. Budd
*Attorneys*—William S. Pettigrew and R. J. Wallace

ABSTRACT: A thick film hybrid integrated circuit including an integrally mounted ceramic filter. A circular ceramic resonator disk having a central aperture therein is seated on a pedestal contact upstanding on a circuit board. The disk is supported on a shoulder of the pedestal so that it is free to resonate in the radial mode. A spring contact secured to the board contacts the exposed face of the disk to retain the disk against the pedestal shoulder.

INVENTOR.
Thomas J. Furnival
BY
Robert J. Wallace
ATTORNEY

METHOD OF MOUNTING A PIEZOELECTRIC DEVICE

BACKGROUND OF THE INVENTION

This invention relates to integrated circuits and more particularly to a thick film hybrid integrated circuit assembly containing an integrally mounted ceramic electrical filtering element.

Ceramic resonators are piezoelectric transducers which can filter an electrical signal analogous to a conventional transformer. These devices are of particular interest to microelectronics in that they can be made quite small. On the other hand, these devices function through physical vibration. Hence, they require special packaging arrangements which will support the transducer element without attenuating the vibrations to be induced. These elements can be made for example, as a circular disk having conductive faces for electrical contact to the element. The disk vibrates radially when a signal is applied to it. Hence, it must be mounted so that it can freely vibrate in a radial mode. It has been previously proposed to support it in rubber, suspend it between supporting wires, and retain it between opposing spring elements. However, some of these package designs are costly, others are not especially durable and still others not particularly compact. In addition, none of them is readily incorporable as an integral part of a microelectronic circuit assembly. They are intended as discrete packages that must be separately mounted on a circuit board.

SUMMARY OF THE INVENTION

Accordingly, it is an object of this invention to provide a new mounting technique for piezoelectric transducers which is particularly useful in the manufacture of thick film hybrid integrated circuits and which is amenable to high volume commercial manufacturing operations.

Another object of this invention is to provide an improved thick film hybrid integrated circuit in which a ceramic resonator is supported directly on a circuit board in a simple and durable manner.

Yet another object of this invention is to provide a method of integrally mounting a ceramic resonator on a circuit board of a thick film hybrid integrated circuit assembly.

In accordance with the present invention a circuit pattern is printed and fired on a face of a ceramic circuit board. The circuit pattern provides two contact pads for a ceramic resonator. A pedestal having a contact shoulder thereon is mounted on the circuit board face and the shoulder electrically connected with one of the contact pads. A ceramic resonator disk having opposed conductive faces and a central aperture therein is nested on the pedestal with one of its faces resting on the pedestal shoulder. The other face contacts a leaf spring, the end of which is attached directly to the circuit board. The pedestal not only projects through the center of the disk but also through an opening in the leaf spring.

BRIEF DESCRIPTION OF THE DRAWING

Other objects, features and advantages of this invention will be more fully understood by the following description of preferred embodiments thereof and from the drawings, in which.

DESCRIPTION OF THE PREFERRED EMBODIMENTS

Figure 1:
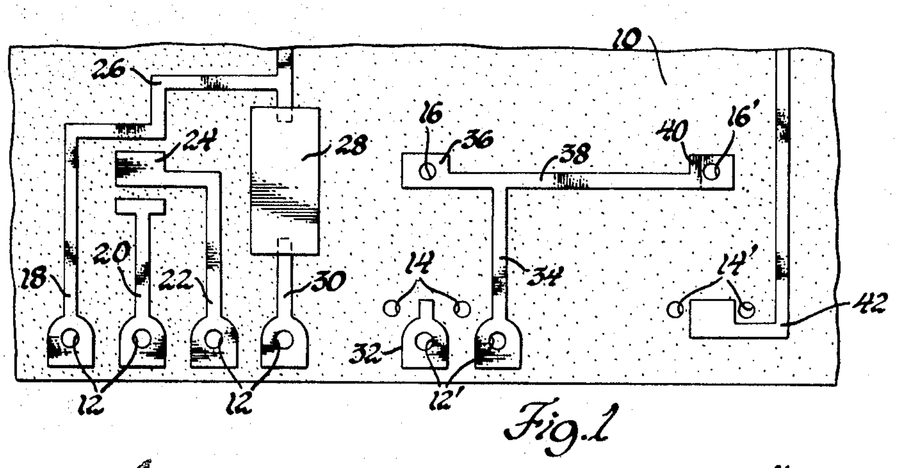
FIG. 1 shows a plan view of a fragmentary part of a ceramic substrate on which a thick film integrated circuit pattern has been printed.

FIG. 1 shows a portion of a ceramic substrate 10 of alumina or the like upon which a thick film circuit pattern has been printed and fired. The substrate 10 has a plurality of apertures 12 and 12' therein to which terminal connector pins are subsequently attached. It also includes perforations 14 and 14' to which a ceramic resonator spring connector is to be attached and apertures 16 and 16' to which ceramic resonator support pedestals are to be attached.

The circuit printed on the substrate includes conductors 18, 20 and 22. Each of conductors 18, 20 and 22 has an enlarged end surrounding one of the apertures 12. Conductors 18 and 20 converge on an enlarged end 24 of conductor 22, which forms a transistor mounting pad. Conductor 18 has an extension 26 which connects to other parts of the circuit (not shown) in parallel with resistor 28. Resistor 28 is in turn connected to conductor 30 which surrounds another of the terminal pin apertures 12. A conductor contact pad 32 surrounds the terminal pin aperture 12' adjacent circuit board perforations 14. Conductor 34 extends from the other terminal pin aperture 12' to a ceramic resonator contact pad 36. This latter conductor 34 has a parallel conductor portion 38 which terminates in a second ceramic resonator contact pad 40 surrounding aperture 16'. Another conductor 42 extends from a region between circuit board apertures 14' to another portion of he circuit (not shown).

The circuit pattern is formed in the normal and accepted way. For example, a mixture of nonoxidizable powdered metal, such as platinum, a temporary organic binder, a vitreous permanent binder, and a suitable vehicle, can be used to print conductors. The conductor mixture is silk screened onto the substrate face and dried. Resistor 28 is then similarly printed onto the substrate face in a space left between conductors 26 and 30. The resistor ink is analogous to that of the conductors. However, the metal content is less, or a more readily oxidizable metal is used in the composition. The thus prepared substrate is then fired to burn out the temporary binder and strongly bond the resulting cermet composition to the substrate. The resultant product is a ceramic circuit board.

Figure 2:
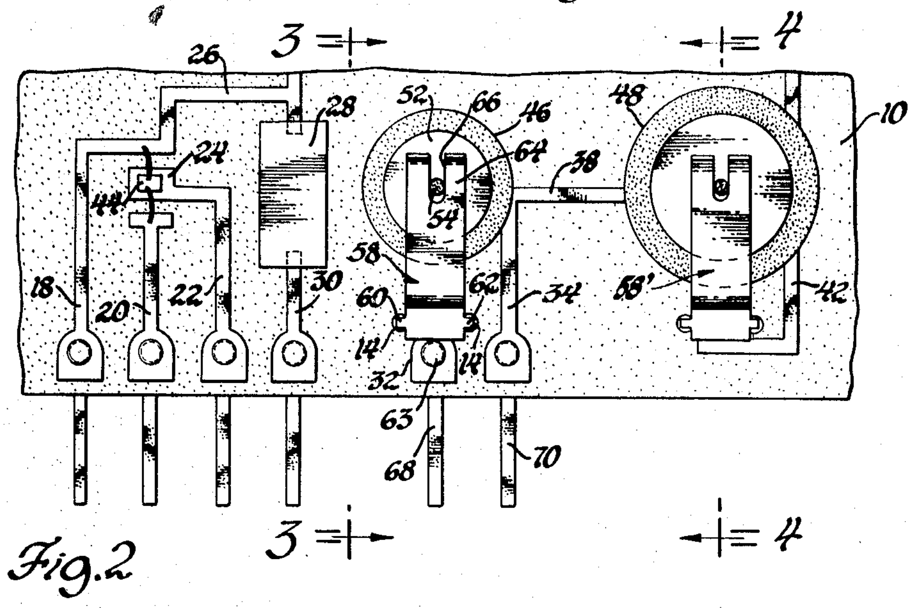
FIG. 2 shows a plan view of the circuit board illustrated in FIG. 1 after mounting circuit devices on it in accordance with the invention.

FIG. 2 shows the circuit board illustrated in FIG. 1 after various devices have been formed on it in accordance with the invention. A transistor die 44 is soldered to the enlarged end 24 of conductor 22 which then forms a collector lead for the transistor. Interconnecting gold wire leads are thermocompression or ultrasonically bonded to adjacent parts of conductors 18 and 20, which then form emitter and base leads for the transistor. Annular ceramic resonator disks 46 and 48 are also directly identically mounted as an integral part of the circuit board assembly.

Figure 3:
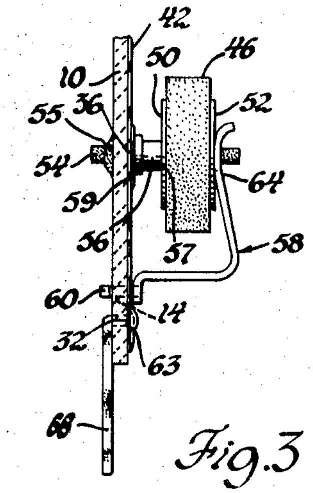
FIG. 3 shows a sectional view taken along lines 3—3 of FIG. 2.

By also referring now to FIG. 3, it can be seen that ceramic resonator disk 46 is an annular element having opposite faces with metallized contacts 50 and 52. The contacts can be of adherent evaporated metal films. Disk 46 also has a central aperture therein at its nodal point. The disk 46 is nested on a nonconductive rod 54 which extends from the board 10 on through the disk. The nonconductive rod 54 is preferably of a rigid plastic such as phenolic resin. However, other materials may be used.

Nonconductive rod 54 is attached to the circuit board with an epoxy adhesive 55. The conductive face portion 50 of the disk is seated on a copper bushing, or ferrule, 56 which provides a contact shoulder 57 spaced from the surface of the circuit board. Copper ferrule 56 is rigidly bonded to contact pad 36 by a layer of solder 59. Thus, a low resistance electrical connection is provided between disk face 50 and circuit board contact pad 36.

Rod 54 and ferrule 56 form a contact pedestal that is upstanding on the face of the circuit board. Ferrule 56 is enlarged adjacent pad 36 to increase pedestal durability. For manufacturing convenience, I prefer to make this pedestal of the two discrete elements described. However, while not preferred, the pedestal can also be formed of a copper rod with an insulating sleeve around the rod where it passes through the disk. The copper rod, of course, would have to have an exposed shoulder for contact with the face of the disk. Also, the pedestal could be unitary, by making it of a nonconductive material and conductively coating the contact shoulder and adjacent end portion to make the low resistance electrical connection with the circuit board. Further, if one does not desire the extreme durability of the preferred embodiment, he may choose not to have the pedestal extend into the board at all. In such instance substrate perforation 16 would be omitted and the pedestal attached only to the face of the mounting pad 36.

An L-shaped contact spring 58 is crimped at 60 and 62 to the circuit board 10 through apertures 14 to mechanically fasten the end of the spring to the circuit board. It is soldered to the contiguous contact pad 32 as well by solder layer 36. The other end 64 of spring element 58 engages contact 52 of resonator 46 and presses the resonator against copper ferrule 56. End 64 of spring 58 has a notch 66, or elongated opening, therein to accommodate the end of pedestal 54 without binding. I prefer a bifurcated end 64 on the spring element 58, instead of merely providing an elongated aperture therein. This, in combination with the L-shape offers a number of benefits. For example, it permits a single spring to be used for a plurality of different disk sizes and facilitates disk mounting.

A terminal connector pin 68 is fastened to the circuit board through aperture 12' and soldered to the surrounding contact pad 32 by solder layer 63. Terminal connector pins are also mechanically fastened to the circuit board through apertures 12 and soldered to the surrounding ends of conductors 18, 20, 22 and 30. Connector pin 70 is similarly fastened through aperture 12' and soldered to the surrounding end of conductor 34.

Figure 4:
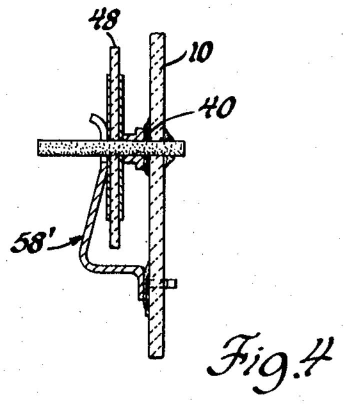
FIG. 4 shows a sectional view taken along lines 4—4 of FIG. 2.

Referring now to the resonator disk 48 shown in FIG. 4, it can be seen that resonator 48 is mounted in the same manner as resonator disk 46. Moreover, an identical spring contact 58' can be used with resonator disks of different diameters and thicknesses. In addition, the resonator disks do not have to be attached to a terminal connector pin contact pad but can be integrated into any part of the circuit. Further, since the resonator disk is spaced above the surface of the circuit board, the circuit pattern can extend beneath the disk on the surface of the circuit board. Consequently, only a very limited portion of the circuit board surface is used when the resonator is integrated into the circuit assembly.

The circuit assembly described can be made without subjecting any of the semiconductor devices which are to be mounted on the circuit board to any undesirable temperatures, fluxes, atmospheres or other environmental conditions. The ceramic resonator pedestal and spring contact are attached to the board before any of the semiconductor device dies are attached. After the semiconductor elements are mounted on the board one need merely lift the spring contact 58, insert the resonator disk on the pedestal, and the assembly is completed.

The solder layers 59 and 63 are provided before circuit board assembly is completed. Solder layer 59 between contact pad 36 and copper ferrule 56 is preferably provided by selectively screening on a solder paste or pretinning the adjacent end of the copper ferrule. Solder layer 63, under the crimped end of contact spring 58 and over contact pad 32, can be similarly provided. On the other hand, it may be desirable to simply solder dip the edge of the circuit board to apply solder to contact pad 32. It may also be desirable to pretin the heads of the terminal pins to insure good bond strength. In any event, the solder is previously applied to the circuit board and/or the related part surfaces before the parts are assembled. In addition, the parts are bonded or otherwise fastened to the substrate prior to soldering so that one need merely heat the circuit board, which is selectively fluxed, to solder the components in place. The circuit board can then be further processed to any degree of completeness and the ceramic resonator disks placed on the pedestal at any time during or after this subsequent processing, as one chooses. One need only lift the spring 58 or 58' and put the ceramic resonator disk in place. Moreover, the disk can be readily removed and reused in another assembly should a defect develop in other parts of the assembly and it has to be scrapped.

I claim:

1. A thick film hybrid integrated circuit assembly that includes an integrally mounted piezoelectric transducer, said assembly comprising a ceramic substrate, a cermet circuit pattern bonded to one face of said substrate, two conductor portions in said circuit pattern for connecting a piezoelectric transducer into said circuit, an upstanding pedestal attached to said substrate face, a shoulder on the pedestal spaced from said face, a low resistance electrical connection between said shoulder and one of said conductor portions, an annular piezoelectric transducer disk having opposed conductive faces and a central aperture nested on said pedestal, one of said conductive disk faces seated on said shoulder and said pedestal projecting through said aperture beyond the other disk face, a leaf spring contact pressing against said other disk face with the pedestal projecting through a leaf spring aperture, an end of the leaf spring rigidly attached to said substrate, and a low resistance electrical connection between said leaf spring and the other circuit conductor portion.

2. A thick film hybrid integrated circuit assembly that includes an integrally mounted piezoelectric transducer, said assembly comprising a ceramic substrate having at least two apertures therein, a cermet circuit pattern bonded to one face of said substrate, a separate conductor portion in said circuit pattern adjacent each of said apertures for connecting a piezoelectric transducer into said circuit, an upstanding pedestal rigidly seated in one of said substrate apertures and contacting the adjacent conductor portion, a shoulder on the pedestal spaced from the substrate face, a low resistance electrical connection between said shoulder and said adjacent conductor portion, an annular piezoelectric transducer disk having opposed conductive faces and a central aperture nested on said pedestal, one of said conductive seated on said shoulder and said pedestal projecting through said disk aperture beyond the other disk face, a leaf spring contact pressing against the other face of said disk with the pedestal projecting through a leaf spring aperture, and an end of the leaf spring fastened to said substrate through the other substrate aperture and soldered to the other conductor portion.

3. A thick film hybrid integrated circuit assembly that includes an integrally mounted piezoelectric transducer, said assembly comprising a ceramic substrate having at least two apertures therein, a cermet circuit pattern bonded to one face of said substrate, a first conductor portion in said circuit pattern surrounding one of said apertures and a second conductor portion at least adjacent the other for connecting a piezoelectric transducer into said circuit, a nonconductive rod upstanding on said face with its lower end bonded within said one substrate aperture a conductive ferrule on said rod soldered to said first conductor portion and providing a contact shoulder spaced from the surface of said substrate, an annular piezoelectric transducer disk having opposed conductive faces and a central aperture nested on said rod, one of said conductive faces seated on said shoulder and said rod projecting through said aperture beyond the other disk face, a bifurcated end of an L-shaped leaf spring pressing against the other face of said disk around said rod, the other end of the leaf spring crimped to said substrate through the other substrate aperture and soldered to said second conductor portion.